(12) United States Patent
Iwata et al.

(10) Patent No.: US 6,201,412 B1
(45) Date of Patent: Mar. 13, 2001

(54) SEMICONDUCTOR INTEGRATED CIRCUIT WITH DRIVER STABILIZATION USING PARASITIC CAPACITANCE

(75) Inventors: Toru Iwata, Osaka; Hironori Akamatsu, Hirakata; Takashi Hirata, Neyagawa, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/123,902

(22) Filed: Jul. 28, 1998

(30) Foreign Application Priority Data

Jul. 30, 1997 (JP) .................................................. 9-205009

(51) Int. Cl.[7] .............................................. H03K 19/0175
(52) U.S. Cl. .............................. 326/83; 326/83; 326/86; 326/121; 326/17; 326/26; 326/27
(58) Field of Search .................... 326/17, 26, 27, 326/83, 86, 121

(56) References Cited

U.S. PATENT DOCUMENTS

| | | | |
|---|---|---|---|
| 5,416,436 | * 5/1995 | Rainard | 327/270 |
| 5,543,744 | * 8/1996 | Okumura | 327/333 |
| 5,585,744 | * 12/1996 | Runas et al. | 326/86 |
| 5,644,255 | * 7/1997 | Taylor | 326/81 |
| 5,672,983 | * 9/1997 | Yamamoto et al. | 326/27 |
| 5,801,550 | * 9/1998 | Tanaka et al. | 326/87 |

FOREIGN PATENT DOCUMENTS

| | | |
|---|---|---|
| 63-136715 | 6/1988 | (JP) . |
| 08203279 | 8/1996 | (JP) . |
| 08203279 | * 9/1996 | (JP) . |

OTHER PUBLICATIONS

M. Horiguchi et al.; 1995 IEEE International Solid–State Circuits Conference FA 14.5: An Experimental 220MHz 1Gb DRAM, p. 252–253; 1995.

* cited by examiner

Primary Examiner—Michael Tokar
Assistant Examiner—Thanh-Tam Le
(74) Attorney, Agent, or Firm—Renner, Otto, Boisselle & Sklar LLP

(57) ABSTRACT

The semiconductor integrated circuit of this invention includes: a driver including a MOS transistor for driving a load; and a stabilizer for stabilizing a change in a voltage at a source of the MOS transistor due to a gate-source parasitic capacitance of the MOS transistor.

11 Claims, 15 Drawing Sheets

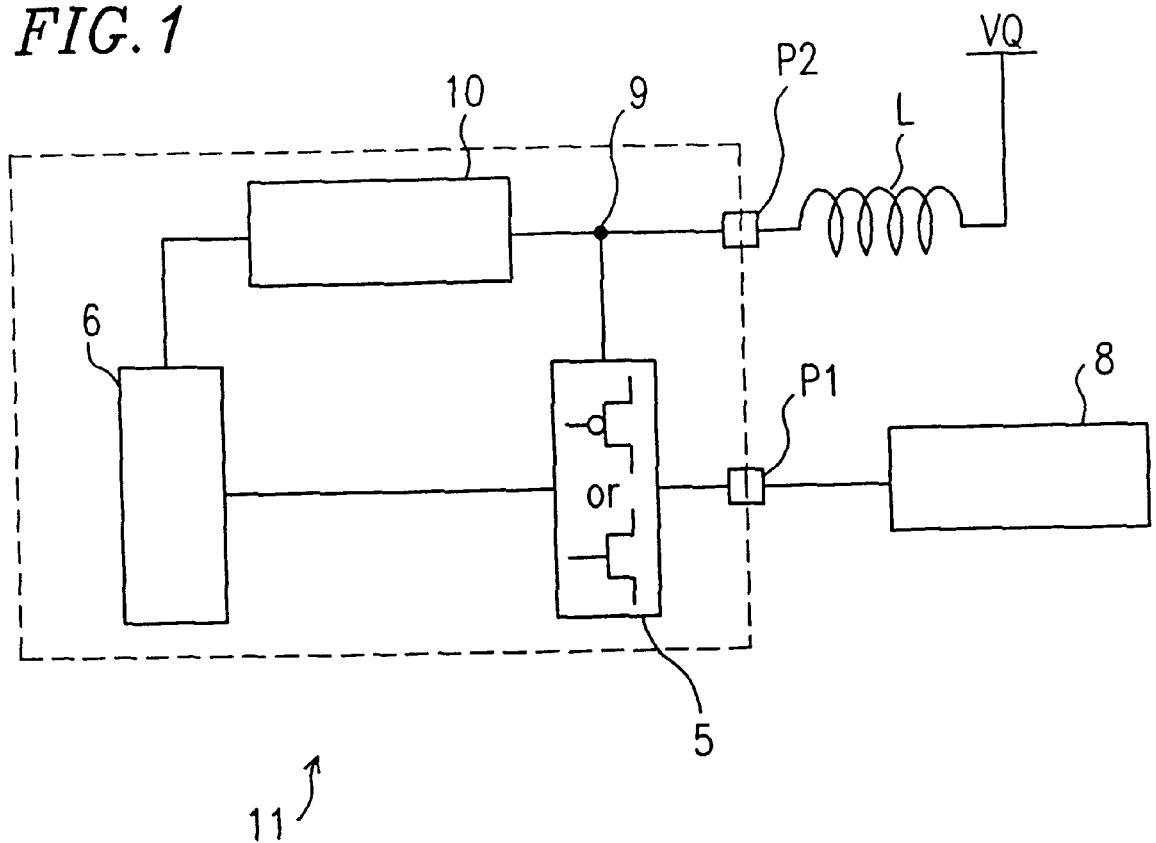

SEMICONDUCTOR INTEGRATED CIRCUIT WITH DRIVER STABILIZATION USING PARASITIC CAPACITANCE

BACKGROUND OF THE INVENTION

1. Field of the Invention

The present invention relates to a semiconductor integrated circuit, and, more particularly, relates to a data output circuit which operates at high speed.

2. Description of the Related Art

For the processing of moving image data, a further increase in the presently attained high data transfer rate is required. Conventionally, in order to increase the data transfer rate, a technique of using a plurality of data lines to realize simultaneous data transfer and conducting the simultaneous data transfer at a high speed has been employed. In such a technique, one driver circuit is required for every data line for the interface with the outside of the chip. Since such a driver circuit drives a load capacitance, the current consumption becomes larger as the transfer speed is increased. This causes an insufficient power supply if the driver circuit is configured to receive power from a power supply line used in common with other circuits. This causes a drop of the supply potential and the like, as well as causing unstable operations of other circuits. In order to overcome this problem, the driver circuit is conventionally provided with individual power supplies VDDQ and VSSQ.

However, at the operation of a driver, a source potential of a MOS transistor constituting the driver changes due to a parasitic capacitance between a gate and a source of the MOS transistor. This adversely affects a signal transfer rate of data.

FIG. 14A is a circuit diagram for illustrating the prior art problem. FIG. 14B is a waveform chart showing the simulation results of the operation of the circuit of FIG. 14A conducted by the inventors of the present invention.

As shown in FIG. 14A, a driver 5 corresponding to one data unit is composed of a p-type MOS transistor 101 and an n-type MOS transistor 102.

In the case where a signal input into the driver 5 transfers from a high level (HIGH) to a low level (LOW) during a time t1 as shown in FIG. 14B, a signal output from the driver 5 transfers from LOW to HIGH. At this time, source potentials int.VDDQ and int.VSSQ drop due to a gate-source parasitic capacitance 111 generated in the MOS transistor 101 and a gate-source parasitic capacitance 112 generated in the MOS transistor 102, during the time t1 as shown in FIG. 14B.

Power supplies VDDQ and VSSQ for applying a voltage to the driver 5 are provided individually from other circuits as described above. When an independent power supply is provided to each driver, the supply capacity at the driver is small, and no element other than the transistor constituting the driver 5 exists at a supply node of the driver 5. Accordingly, when a parasitic capacitance is generated between a gate and a source of the same transistor of the driver 5, the potential at a source node of the transistor of the driver 5 transfers depending on a change in the gate potential of the driver 5. As a result, the time period during which the potential at a pad P1 which is the output terminal of the driver 5 is established is delayed by a time t2 compared with an ideal case.

In particular, when the driver 5 drives a load at a high frequency, the change in the potential at the source node greatly affects the operation of the driver 5. The source node is connected to the power supply VDDQ or VSSQ via a bonding wire which has an inductance L, as shown in FIG. 14A. The inductance L prevents charges from being supplied to and drained from the source node.

FIG. 15 is a graph showing the simulation results of the change in the potential at the source node when the potential at a node A of the circuit shown in FIG. 14A transfers from HIGH to LOW, conducted by the inventors of the present invention. More specifically, FIG. 15 shows the changes (P200, P400, P600, P800, P1000) in the potentials at the source node observed when the time period during which the potentials (A200, A400, A600, A800, A1000) at the node A transfer from 1.5 volts to 0 volt is changed between 200 picoseconds (ps) and 1 nanosecond (ns).

A curve P200 shows that the change in the potential at the source node cannot be suppressed within 10% of the constant voltage (1.5 V) when a signal at the node A transfers from HIGH to LOW in 200 ps. In general, the transfer period (twice the transfer time (e.g., HIGH to LOW) described above) is 50% or less of a signal period. For example, in the case where the curve P200 represents part of a signal which transfers from HIGH to LOW in 200 ps, remains LOW for 200 ps, transfers from LOW to HIGH in 200 ps, and remains HIGH for 200 ps, the frequency of this signal is 1.25 GHz. Assuming that the gate-source voltage is 1.5 V and the threshold voltage of the transistor is 0.5 V, if the potential at the source node drops by 10%, the driving current of the transistor of the driver drops by 30%, delaying the timing at which the transistor is turned on. Specifically, a delay of several hundred picoseconds is generated until the data to be output by the driver is established. The drop of the potential at the source node becomes greater if a signal having a frequency of 1.25 GHz or more is input into the driver of FIG. 14A. This further increases the time required until the value of data to be output by the driver is established.

Thus, as is observed from FIG. 15, it is difficult to output data at a frequency of 1 GHz or more from the circuit of FIG. 14A due to the delay described above.

SUMMARY OF THE INVENTION

The semiconductor integrated circuit of this invention includes: a driver including a MOS transistor for driving a load; and a stabilizer for stabilizing a change in a voltage at a source of the MOS transistor due to a gate-source parasitic capacitance of the MOS transistor.

In one embodiment of the invention, the driver drives the load at a frequency of 1 GHz or more.

In another embodiment of the invention, when the potential at the source of the MOS transistor transfers from a first potential to a second potential different from the first potential, the stabilizer supplies charges to the source so as to stabilize the change in the potential at the source.

In still another embodiment of the invention, the semiconductor integrated circuit further includes a logic circuit including a MOS transistor for generating a signal received by the driver, wherein the stabilizer includes a coupler for coupling the source of the MOS transistor of the driver and a source of the MOS transistor of the logic circuit to a first power supply.

In still another embodiment of the invention, the first power supply includes one of a grounding power supply and a power supply having a potential higher than the grounding power supply.

In still another embodiment of the invention, the semiconductor integrated circuit further includes a logic circuit, wherein the stabilizer includes a capacitor for coupling the source of the MOS transistor of the driver and a node of the logic circuit at which a potential transfers in reverse to a change in a potential at a gate of the MOS transistor of the driver.

In still another embodiment of the invention, the capacitor includes a feed effect transistor having a drain and a source coupled with each other.

In still another embodiment of the invention, the driver further includes an additional MOS transistor connected in series with the MOS transistor, and the stabilizer includes: a first power supply and a second power supply different from the first power supply, and a first capacitor coupled to the source of the MOS transistor and the first power supply and a second capacitor coupled to a source of the additional MOS transistor and the second power supply.

In still another embodiment of the invention, each of the first and second capacitors includes a feed effect transistor having a drain and a source coupled with each other.

Thus, the invention described herein makes possible the advantage of providing a semiconductor integrated circuit including a driver provided with a corresponding power supply, which can stabilize a voltage change generated at a source of the driver due to a change in the gate potential of the driver and thus transmit data correctly at a high speed.

These and other advantages of the present invention will become apparent to those skilled in the art upon reaching and understanding the following detailed description with reference to the accompanying figures.

BRIEF DESCRIPTION OF THE DRAWINGS

FIG. 1 is a view illustrating the concept of the present invention.

DESCRIPTION OF THE PREFERRED EMBODIMENTS

Figure 2A:
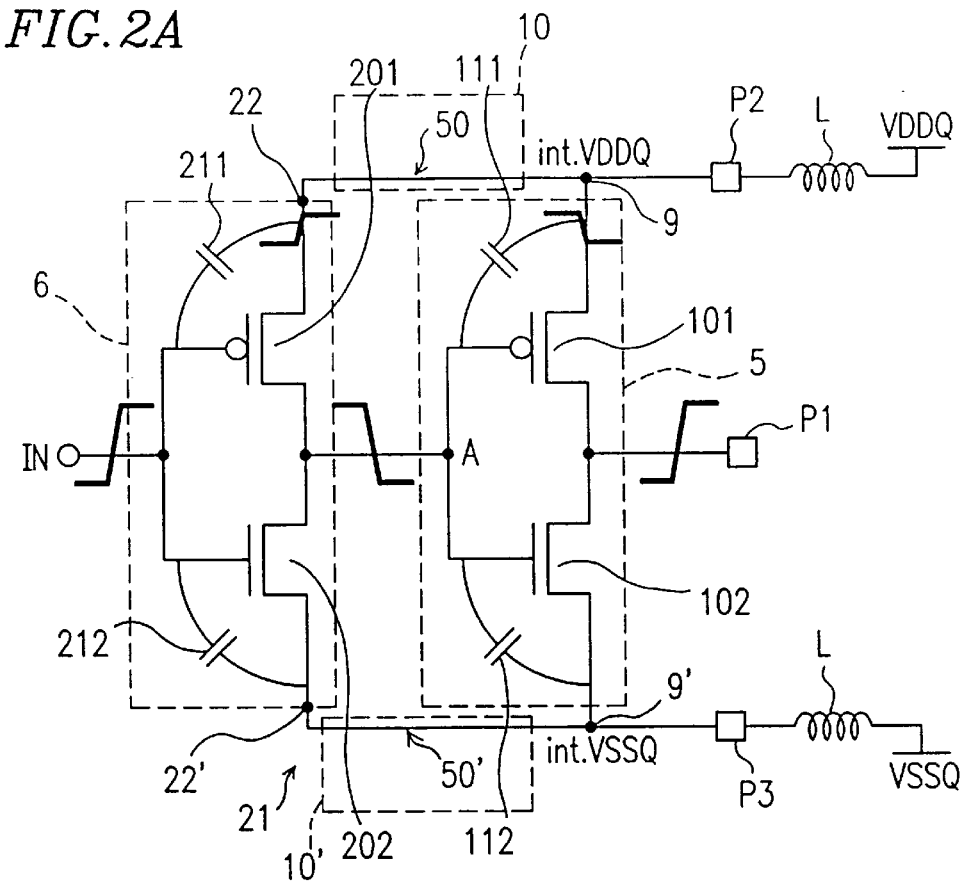
FIG. 2A is a circuit diagram of a semiconductor integrated circuit according to Example 1 of the present invention.

First, the principle of the semiconductor integrated circuit according to the present invention will be described.

When a driver at the last stage of the semiconductor integrated circuit, i.e., a driver which outputs a signal outside of the chip, is controlled by a control circuit at the preceding stage, a noise (a changing component) generated at a supply node of the driver at the last stage is cancelled by a noise having a phase reverse to the former noise, so as to reduce the change in the potential at the supply node.

FIG. 1 is a view illustrating the principle of the present invention.

Referring to FIG. 1, a semiconductor integrated circuit 11 according to the present invention includes a driver 5 for driving a load 8, a control circuit 6 for controlling the driver 5, a stabilizer 10.

The driver 5 receives a signal from the control circuit 6 and drives the load 8 via a pad P1 based on the received signal. The driver 5 includes a MOS transistor, which has a parasitic capacitance generated between a gate and a source thereof.

The source of the MOS transistor of the driver 5 is connected to a node 9 and is supplied with a power for driving the load 8 from a power supply VQ. The power supply VQ may be a grounding power supply or a power supply having a potential higher than the grounding potential.

The node 9 is affected by a voltage change of the driver 5 caused by the parasitic capacitance generated between the gate and the source of the MOS transistor of the driver 5. However, the stabilizer 10 stabilizes the voltage change due to the parasitic capacitance. Specifically, the stabilizer 10 receives a signal, i.e., a charge, from the control circuit 6, and suppresses a noise generated due to the gate-source parasitic capacitance based on the signal. In other words, the stabilizer 10 conducts a feedforward control for the node 9 based on the signal received from the control circuit 6. More specifically, the stabilizer 10 directly and/or indirectly couples the node 9 with a node of the control circuit 6 at which the potential changes in reverse to the potential change generated at the source and the gate of the MOS transistor of the driver 5.

The semiconductor integrated circuit 11 may include a plurality of stabilizers. For example, a first stabilizer may be connected to a grounding power supply, while a second stabilizer may be coupled to a power supply having a potential higher than the grounding potential at one end.

The semiconductor integrated circuit 11 is connected to the power supply VQ via a bonding wire which has an inductance L. The inductance L of the bonding wire prevents charges from being supplied to and drained from the node 9. This is particularly eminent when the load 8 is driven at a frequency of 1 GHz or more. However, according to the present invention, since the stabilizer 10 stabilizes the voltage change due to the gate-source parasitic capacitance as described above, the semiconductor integrated circuit 11 can drive the load 8 at a frequency of 1 GHz or more.

Hereinbelow, the semiconductor integrated circuit according to the present invention will be described by way of examples with reference to the accompanying drawings. Throughout the drawings, the same components are denoted by the same reference numerals including FIG. 1.

EXAMPLE 1

FIG. 2A is a circuit diagram of a semiconductor integrated circuit of Example 1 according to the present invention.

Referring to FIG. 2A, a semiconductor integrated circuit 21 of this example includes a driver 5, a control circuit 6 for controlling the driver 5, and stabilizers 10 and 10'. The driver 5 includes a p-type MOS transistor 101 and an n-type MOS transistor 102. The control circuit 6 includes a p-type MOS transistor 201, an n-type MOS transistor 202, and nodes 22 and 22'. The stabilizer 10 includes an interconnect 50 for coupling a node 9 and the node 22. Likewise, the stabilizer 10' includes an interconnect 50' for coupling a node 9' and the node 22'.

A gate and a source of the p-type MOS transistor 101 of the driver 5 are electrically coupled with each other via a capacitance 111, while a gate and a source of the n-type MOS transistor 102 of the driver 5 are electrically coupled with each other via a capacitance 112. Likewise, a gate and a source of the p-type MOS transistor 201 of the control circuit 6 are electrically coupled with each other via a capacitance 211, while a gate and a source of the n-type MOS transistor 202 of the control circuit 6 are electrically coupled with each other via a capacitance 212. Each of the capacitances 111, 112, 211, and 212 is a gate-source parasitic capacitance generated in a MOS transistor.

FIG. 2A also shows marks indicating the potential transfers at the relevant points in the circuit by bold lines. These marks indicate the following. When the potential at a node IN transfers from LOW to HIGH, the potential at the source of the p-type MOS transistor 201 transfers from LOW to HIGH. This transfers the potential at a node A from HIGH to LOW, and then the potential at the source of the p-type MOS transistor 101 from HIGH to LOW. Then, the potential at a pad P1 transfers from LOW to HIGH. These marks are also applicable to the relevant drawings referred to in the subsequent examples.

Hereinbelow, the operation of the semiconductor integrated circuit 21 will be described with reference to FIG. 2B.

Figure 2B:
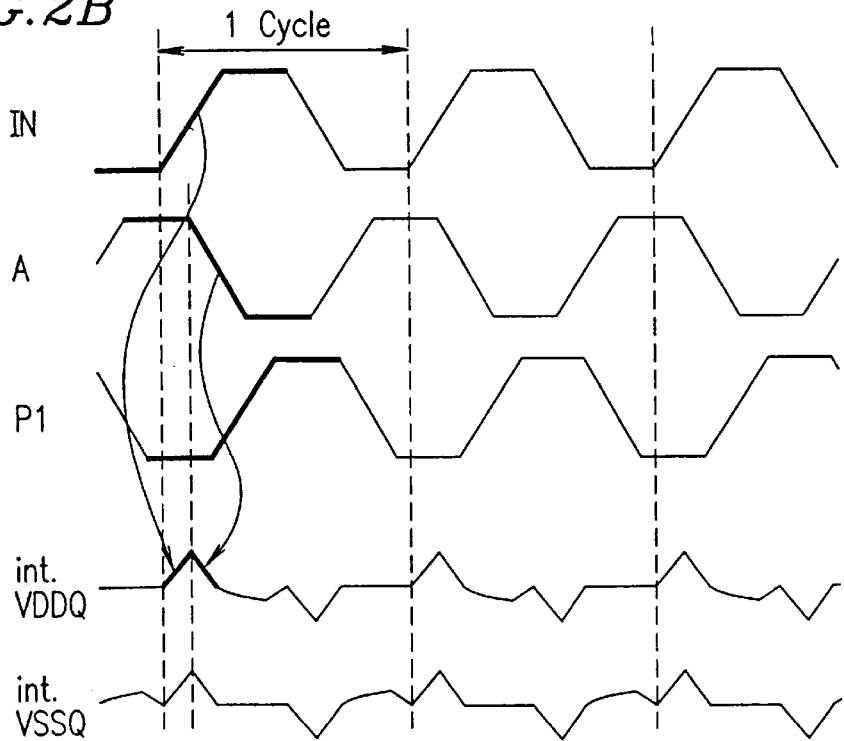
FIG. 2B is a waveform chart of the semiconductor integrated circuit of Example 1.

FIG. 2B is a chart showing the waveforms at respective points of the semiconductor integrated circuit 21.

Referring to FIG. 2B, when the potential at the node IN transfers from LOW to HIGH, source potentials int.VDDQ and int.VSSQ of the driver 5 first rise due to the capacitances 211 and 212. The potential at the output node of the control circuit 6, i.e., the potential at the input node A of the driver 5 transfers from HIGH to LOW on receipt of the input. This drops the source potentials int.VDDQ and int.VSSQ of the driver 5 due to the capacitances 111 and 112. However, this drop of the source potentials int.VDDQ and int.VSSQ can be mitigated due to the effect of the capacitances 211 and 212 which continue to raise the source potentials int.VDDQ and int.VSSQ. In other words, as the potential at the node A drops, the source potential int.VDDQ drops due to the parasitic capacitance 111. At the same time, however, the source potential int.VDDQ is transferred toward a higher level as the potential at the node IN rises due to the parasitic capacitance 211. This results in stabilizing the change in the source potential int.VDDQ.

The above stabilization of the change in the source potential int.VDDQ is realized with the interconnect 50 of the stabilizer 10. The stabilization of the change in the source potential int.VSSQ is also realized with the stabilizer 10' in the manner as described above.

The ability of the stabilizers 10 and 10' for stabilizing the change in the source potential is intensified if the gate-source parasitic capacitances 111, 112, 211, and 212 of the MOS transistors 101, 102, 201, and 202 satisfy the following conditions: The gate-source capacitance 111 is substantially equal to the gate-source capacitance 211, and the gate-source capacitance 112 is substantially equal to the gate-source capacitance 212.

If the above conditions are not satisfied, capacitance element(s) may be provided in addition to the gate-source parasitic capacitances existing in the transistors of the driver 5 and the control circuit 6, so that the capacitance between the gate and the source of the p-type MOS transistor 101 and the capacitance between the gate and the source of the p-type MOS transistor 201 are substantially equal to each other, and that the capacitance between the gate and the source of the n-type MOS transistor 102 and the capacitance between the gate and the source of the n-type MOS transistor 202 are substantially equal to each other. Such capacitance element(s) may be formed by coupling the source and the drain of each of the MOS transistors.

The control circuit 6 is not restricted to the C-MOS inverter composed of the MOS transistors 201 and 202 as described above. For example, the control circuit 6 may be a NAND circuit or a NOR circuit.

Although the semiconductor integrated circuit 21 shown in FIG. 2A is provided with the stabilizers 10 and 10', it may be provided with only one stabilizer.

EXAMPLE 2

Figure 3A:
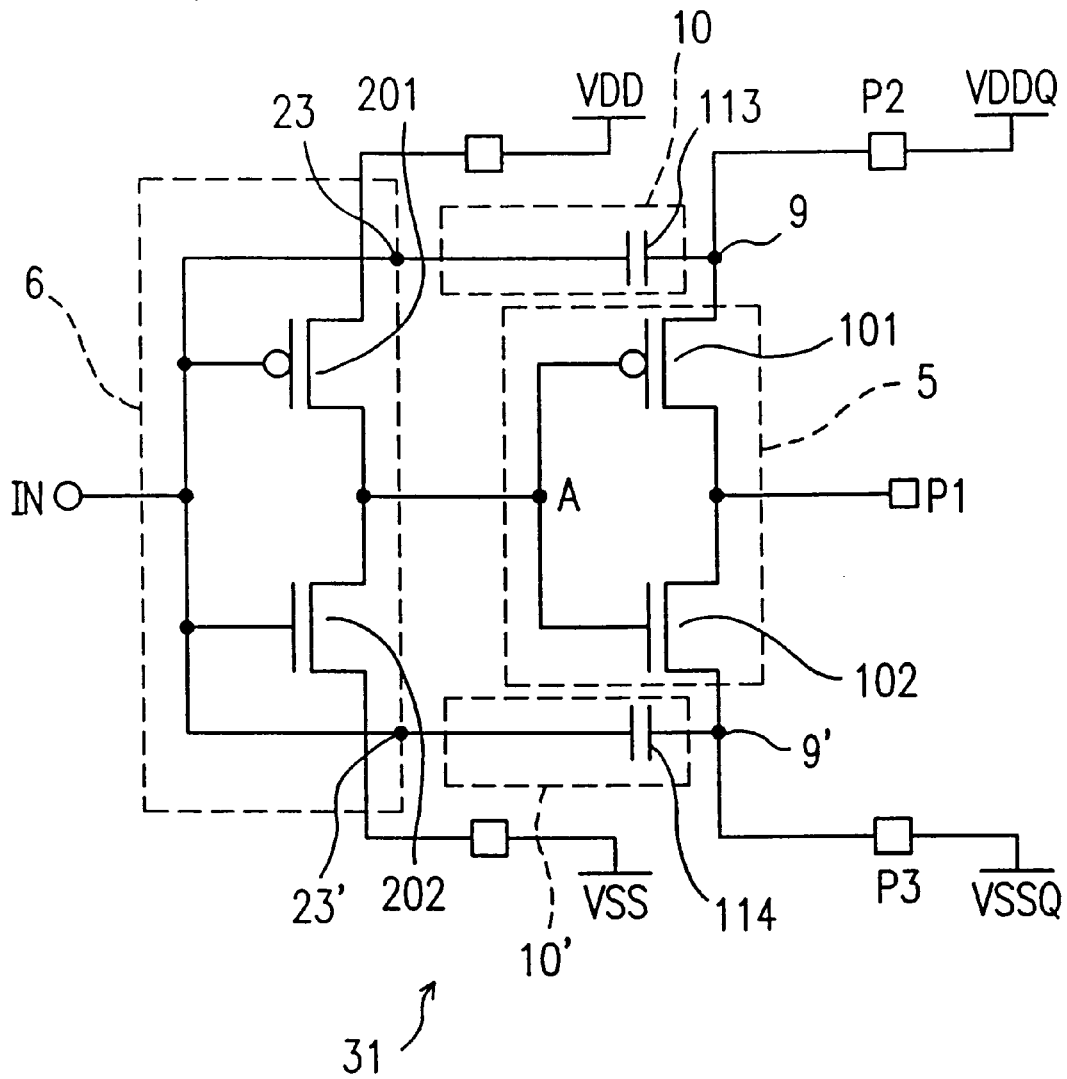
FIG. 3A is a circuit diagram of a semiconductor integrated circuit according to Example 2 of the present invention.

FIG. 3A is a circuit diagram of a semiconductor integrated circuit of Example 2 according to the present invention.

Referring to FIG. 3A, a semiconductor integrated circuit 31 of this example includes a driver 5, a control circuit 6 for controlling the driver 5, and stabilizers 10 and 10'.

The driver 5 includes a p-type MOS transistor 101 and an n-type MOS transistor 102. The control circuit 6 includes a p-type MOS transistor 201, an n-type MOS transistor 202, and nodes 23 and 23'. The stabilizer 10 includes a capacitor 113 for coupling a node 9 and the node 23. The stabilizer 10' includes a capacitor 114 for coupling a node 9' and the node 23'.

The capacitance of the capacitor 113 is preferably substantially equal to the capacitance between a gate and a source of the p-type MOS transistor 101. Likewise, the capacitance of the capacitor 114 is preferably substantially equal to the capacitance between a gate and a source of the n-type MOS transistor 102.

Figure 3B:
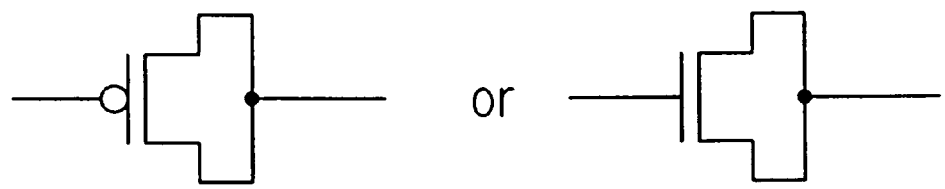
FIG. 3B is an example of a capacitor obtained by coupling a source and a drain of a MOS transistor.

The capacitor 113 is preferably formed by coupling a source and a drain of a MOS transistor as shown in FIG. 3B. In general, the gate capacitance of a MOS transistor is greater than the gate-source capacitance thereof by the order of one digit. Accordingly, the semiconductor integrated circuit having the capacitor 113 utilizing the gate capacitance can be reduced in size by about one-tenth, compared with that utilizing the gate-source capacitance. Likewise, the capacitor 114 is preferably formed by coupling a source and a drain of a MOS transistor. Assuming that the fan-out of the inverter constituting the control circuit 6 is 4, in order to minimize the change in the supply potential at the driver 5 by utilizing the gate-source capacitance of the control circuit 6, the size of the transistor of the control circuit 6 must be quadrupled. When a coupling capacitor utilizing the gate capacitance is used for minimizing the potential change, it is only necessary to increase the gate area of the control circuit 6 by about 1.3 times. Thus, the increase in the current consumption and the layout area can be mitigated.

In general, a semiconductor integrated circuit is provided with a plurality of drivers such as the driver 5 in order to drive a plurality of loads. In this case, the changes in the source potentials of MOS transistors constituting the drivers due to the changes in the gate potentials thereof are different depending on the data patterns.

Figure 14A:
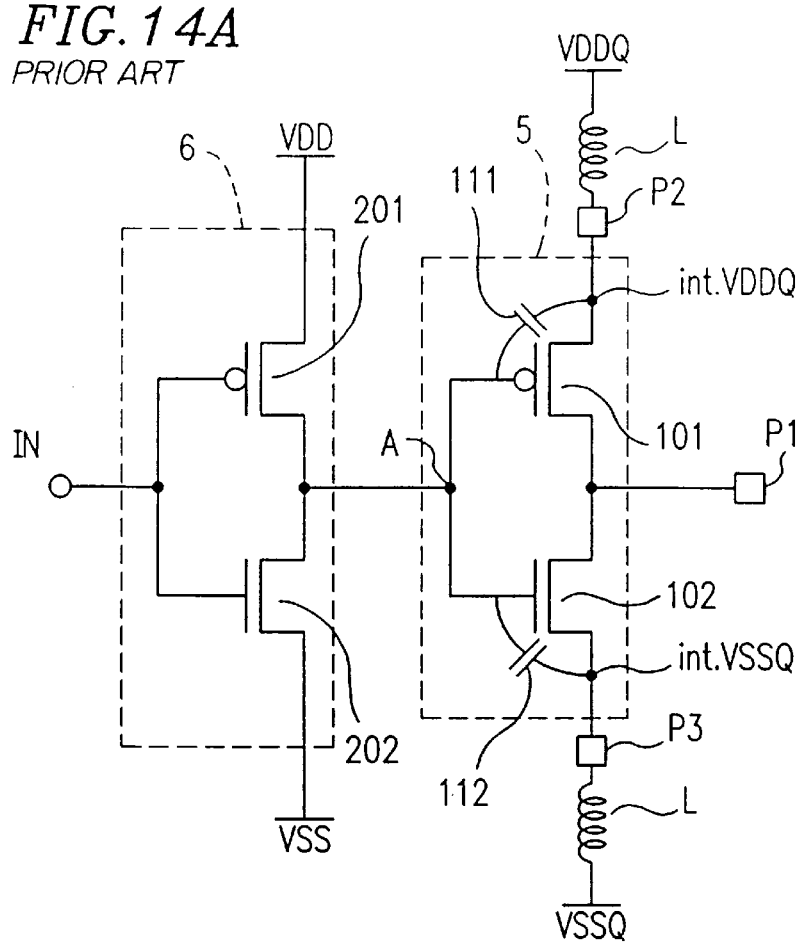
FIG. 14A is a circuit diagram for describing the prior art problem.

For example, assume that the semiconductor integrated circuit shown in FIG. 14A is provided with eight drivers, i.e., the semiconductor integrated circuit outputs 8-bit data. In the case where the eight bits transfer in the same direction simultaneously, the delay in the data transfer is largest among other cases due to noise appearing at the source nodes of the eight drivers. This is because respective noise due to the transfers in the gate potentials of the eight drivers appearing at the source nodes of the drivers via gate-source parasitic capacitances are superimposed. This is the worst case.

In the case where seven bits among the eight bits transfer in the same direction simultaneously and the remaining one bit transfers in a different direction, the data transfer of the one bit is accelerated due to a noise appearing at the source node of the driver of the one bit which has transferred in the reverse direction. This is because the noise corresponding to the seven bits serve to increase the gate-source potential of the remaining one bit. This is the best case.

Figure 4:
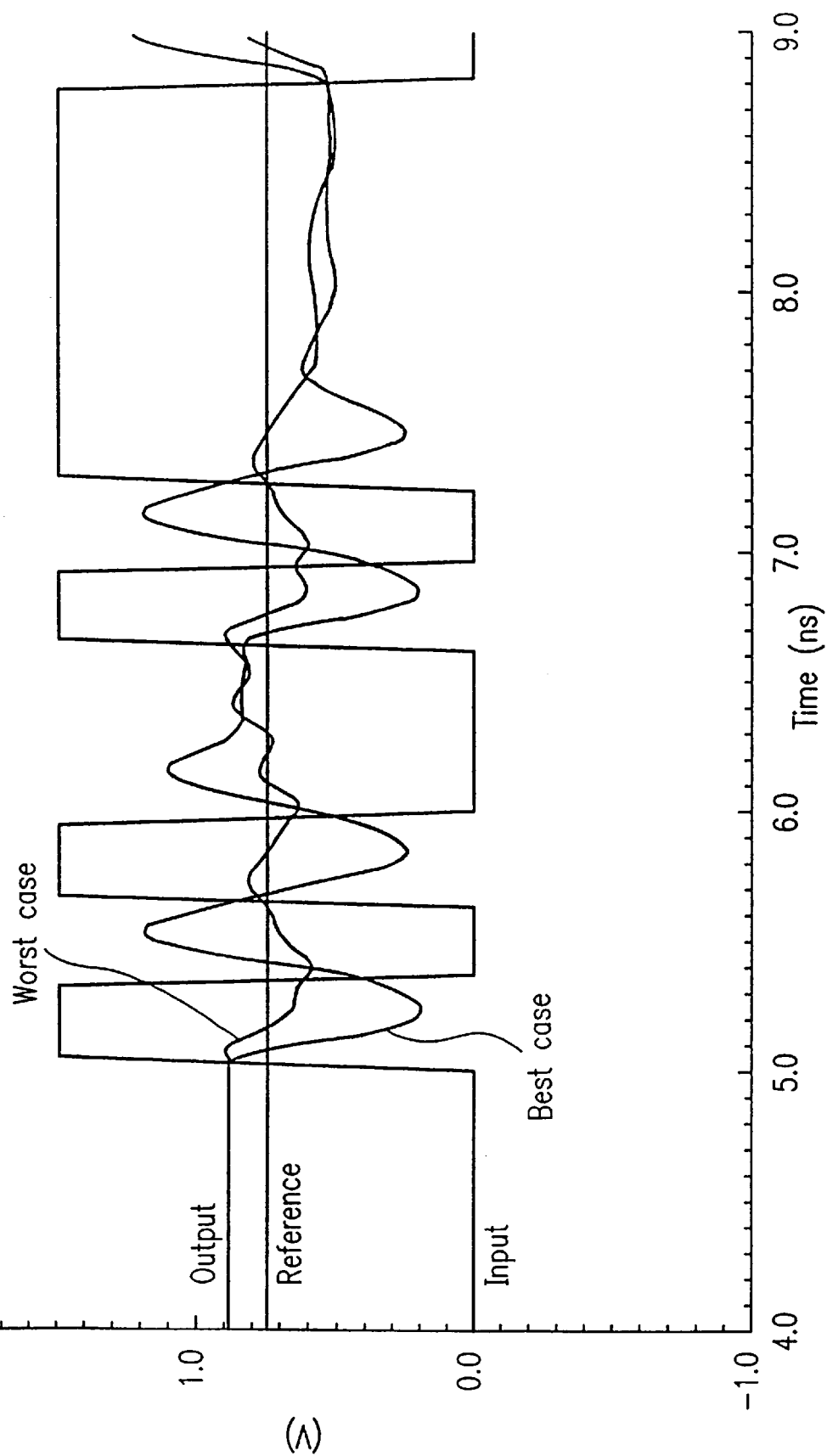
FIG. 4 is a graph showing the waveforms of signals input into and output from a driver of a conventional semiconductor integrated circuit.

FIG. 4 is a graph showing the waveforms of the signals input into and output from a driver of a conventional semiconductor integrated circuit in the best case and the worst case. The conventional semiconductor integrated circuit shown in FIG. 14A is assumed to be provided with eight drivers as described above.

As is observed from FIG. 4, in the worst case, the conventional semiconductor integrated circuit fails to operate normally.

Figure 5:
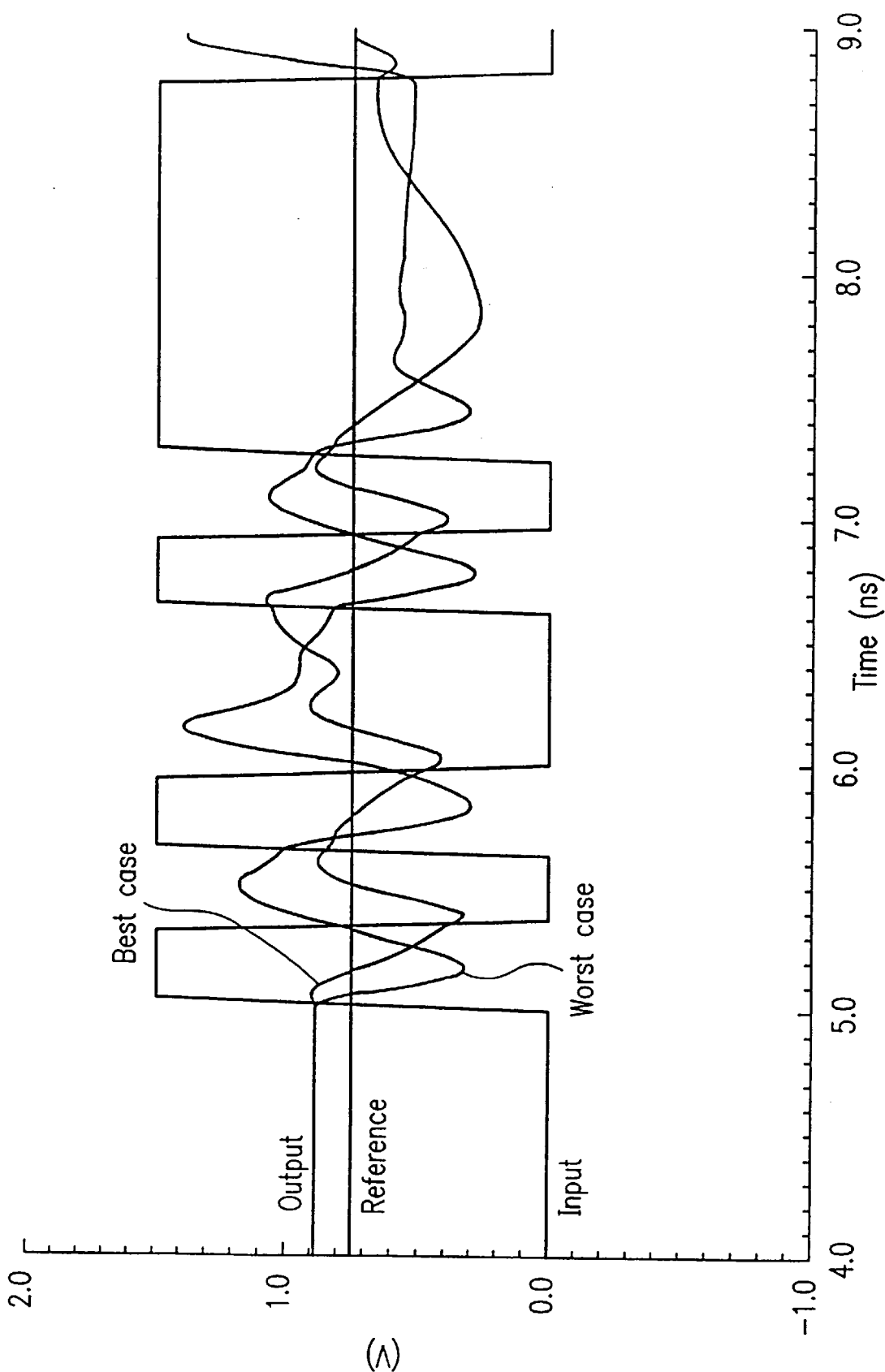
FIG. 5 is a graph showing the waveforms of signals input into and output from a driver of the semiconductor integrated circuit of Example 2.

Then, assume that the semiconductor integrated circuit 31 of FIG. 3 is provided with eight drivers, i.e., the semiconductor integrated circuit 31 outputs 8-bit data. FIG. 5 is a graph showing the waveforms of the signals input into and output from one of the eight drivers in the best case and the worst case. As is observed from FIG. 5, the semiconductor integrated circuit 31 provided with the stabilizers 10 and 10' can transmit data both in the best case and the worst case.

In the simulation of which results are shown in FIG. 5, the capacitance values of the capacitors 113 and 114 shown in FIG. 3 were set sufficiently large to mitigate the noise in the worst case. This resulted in disturbing the waveform in the best case. Both the suppression of the noise in the worst case and the stabilization of the waveform in the best case can be realized by optimizing the capacitance values of the capacitors 113 and 114.

Although the semiconductor integrated circuit 31 shown in FIG. 3A is provided with the stabilizers 10 and 10', it may be provided with only one stabilizer.

EXAMPLE 3

Figure 6:
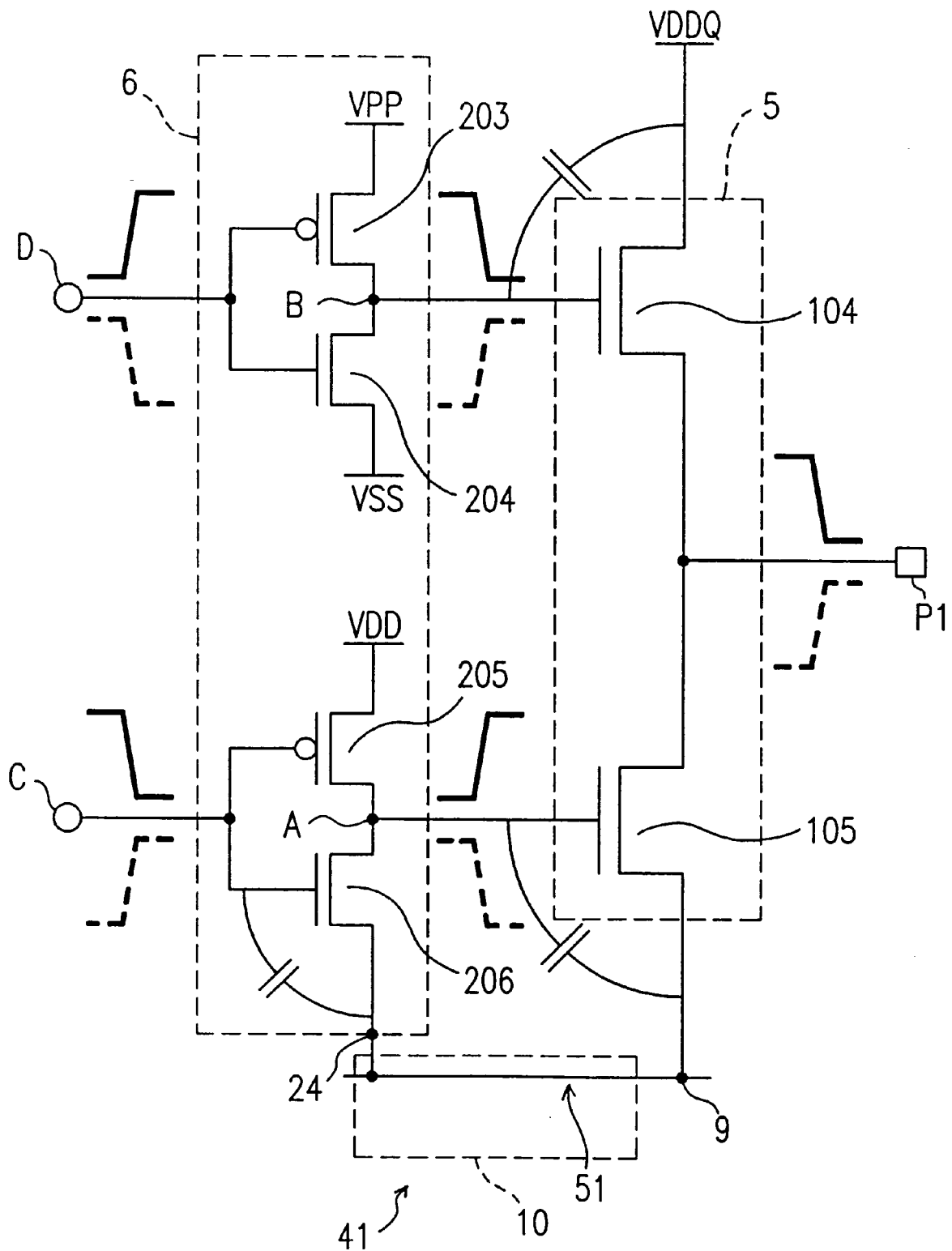
FIG. 6 is a circuit diagram of a semiconductor integrated circuit according to Example 3 of the present invention.

FIG. 6 is a circuit diagram of a semiconductor integrated circuit of Example 3 according to the present invention.

Referring to FIG. 6, a semiconductor integrated circuit 41 of this example includes a driver 5 which is an n-type MOS inverter, a control circuit 6 for controlling the driver 5, and a stabilizer 10.

The driver 5 includes n-type MOS transistors 104 and 105. The control circuit 6 includes p-type MOS transistors 203 and 205, n-type MOS transistors 204 and 206, and a node 24. The stabilizer 10 includes an interconnect 51 for coupling a node 9 and the node 24.

Hereinbelow, the operation of the semiconductor integrated circuit 41 will be described. In FIG. 6, marks indicating the potential transfers at the relevant points in the circuit are shown by broken lines, in addition to those shown by bold lines. It should be noted that the marks shown by the solid lines represent one sequence of potential transfers, while the marks shown by the broken lines represent another sequence of potential transfers, as will be described below. This is also applicable to the relevant drawings referred to hereinafter.

The potential at nodes A and B are LOW when the circuit is not operated. When the driver 5 is activated and outputs a high-level signal, only the potential at the node B is HIGH. When the driver 5 is activated and outputs a low-level signal, only the potential at the node A is HIGH. If both the n-type MOS transistors 104 and 105 are turned on, a through current flows from a power supply VDDQ through the node 9. This logic combination is therefore prohibited.

When a signal shown by the bold line is input into a terminal C, the potential at the node A transfers from LOW to HIGH. This transfers the potential at a pad P1 from HIGH to LOW. That is, the potential at the node A transfers in reverse to the transfer of the potential at the pad P1. This causes the potential at the node 9 to rise. This change in the potential at the node 9 results in decreasing the transfer rate of the signal output from the driver 5. Actually, however, since the semiconductor integrated circuit 41 of this example shown in FIG. 6 is provided with the stabilizer 10, the decrease in the transfer rate of the signal output from the driver 5 can be mitigated due to the following reason.

Since the potential at the terminal C drops when the potential at the node A rises, the potential at the node 24 drops due to a gate-source capacitance of the n-type MOS transistor 206. Since the node 24 is coupled with the node 9 by the stabilizer 10, the potential rise at the node 9 is mitigated.

On the contrary, when a signal shown by the broken line is input into the terminal C, the potential at the node A transfers from HIGH to LOW. This transfers the potential at the pad P1 from LOW to HIGH. That is, the potential at the node A transfers in reverse to the transfer at the pad P1. This causes the potential at the node 9 to drop. This change in the potential at the node 9 results in decreasing the transfer rate of the signal output from the driver 5. Actually, however, since the semiconductor integrated circuit 41 of this example shown in FIG. 6 is provided with the stabilizer 10, the decrease in the transfer rate of the signal output from the driver 5 can be mitigated due to the following reason.

Since the potential at the terminal C rises when the potential at the node A drops, the potential at the node 24 rises due to the gate-source capacitance of the n-type MOS transistor 206. Since the node 24 is coupled with the node 9 by the stabilizer 10, the potential drop at the node 9 is mitigated.

At this time, it is not necessary to consider the change in the supply voltage due to the potential transfer at the node B due to the following reason.

When a signal shown by the solid line is input into a terminal D, the potential at the node B transfers from HIGH to LOW. This transfers the potential at the pad P1 from HIGH to LOW. In other words, the transfer of the potential at the node B is the same as the transfer of the potential at the pad P1. Therefore, the voltage change at the power supply VDDQ serves to increase the transfer rate of the signal output from the driver 5.

When a signal shown by the broken line is input into the terminal D, the potential at the node B transfers from LOW to HIGH. This transfers the potential at the pad P1 from LOW to HIGH. In other words, the transfer of the potential at the node B is the same as the transfer of the potential at the pad P1. Therefore, the voltage change at the power supply VDDQ serves to increase the transfer rate of the signal output from the driver 5.

In this example, the gate-source capacitance of the n-type MOS transistor 206 and the gate-source capacitance of the n-type MOS transistor 105 are preferably made equal to each other. To achieve this equalization of the gate-source capacitances, the gate widths of the n-type MOS transistors 105 and 206 may be made equal to each other.

The stabilizer 10 shown in FIG. 6 includes the coupling between the node 24 and the node 9. Alternatively, the stabilizer 10 may include the coupling between the node 9 and a node at which the potential transfers in reverse to the potential change at the gate of the n-type MOS transistor 105.

Hereinbelow, referring to FIGS. 7 and 8, alternative examples of the semiconductor integrated circuit of Example 3 where the stabilizer 10 uses a capacitor for coupling the node 9 and a node at which the potential transfers in reverse to the potential change at the gate of an n-type MOS transistor connected to the node 9.

Figure 7:
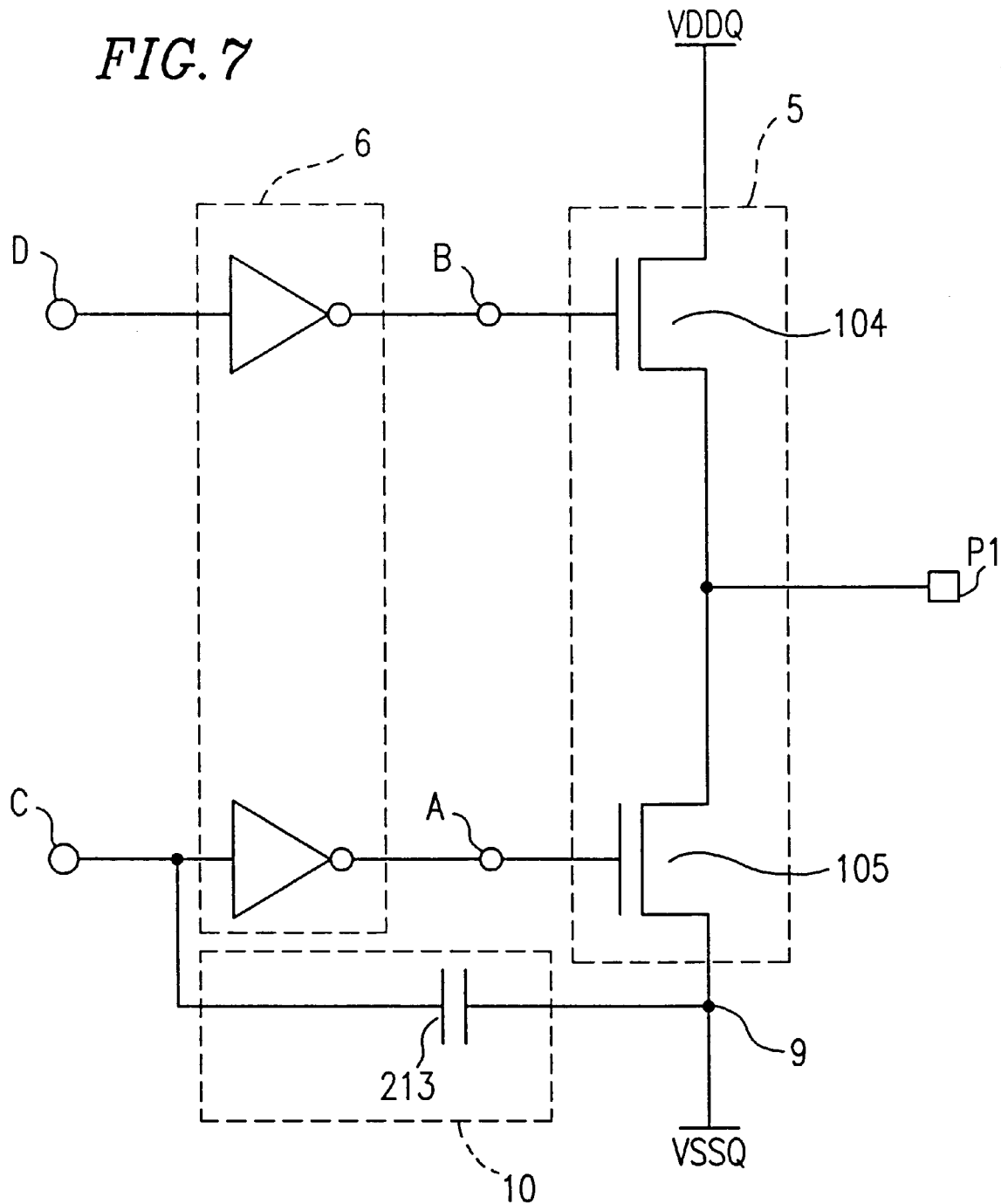
FIG. 7 is a circuit diagram of another semiconductor integrated circuit of Example 3, where a stabilizer includes a capacitor.

A stabilizer 10 shown in FIG. 7 includes a capacitor 213 for coupling a node 9 and a node C. As the potential at a node A drops, the potential at the node 9 also drops. At the same time, however, since the potential at the node C rises when the potential at the node A drops, the potential at the node 9 is transferred toward a higher level due to the capacitance of the capacitor 213. This results in mitigating the drop of the potential at the node 9. The stabilizer 10 also mitigates the rise of the potential at the node 9 observed when the potential at the node A rises.

The capacitance of the capacitor 213 is preferably substantially equal to the capacitance between a gate and a source of an n-type MOS transistor 105. The capacitor 213 is preferably formed by coupling a source and a drain of a MOS transistor as shown in FIG. 3B.

Figure 8:
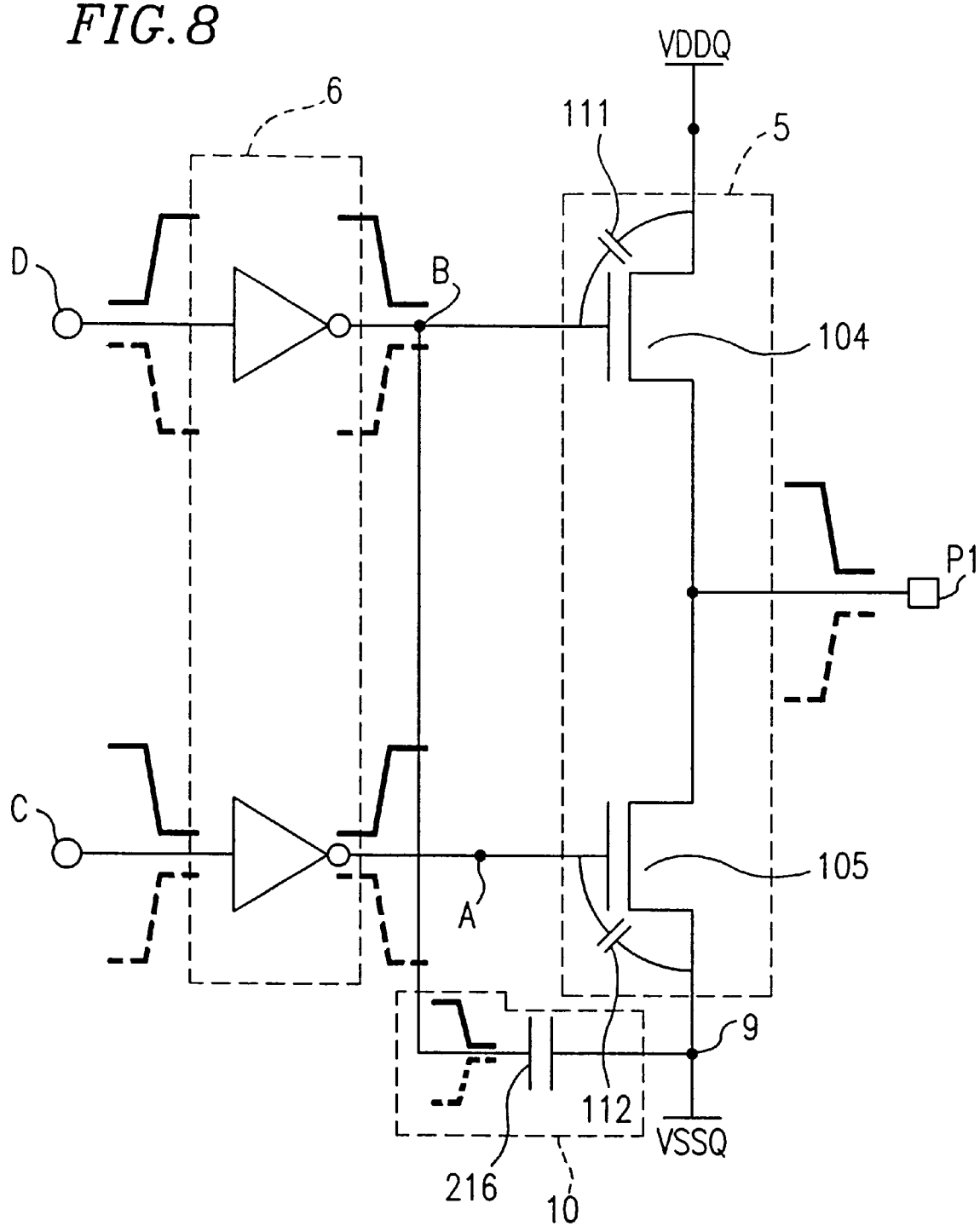
FIG. 8 is a circuit diagram of still another semiconductor integrated circuit of Example 3, where a stabilizer includes a capacitor.

A stabilizer 10 shown in FIG. 8 includes a capacitor 216 for coupling a node 9 and a node B. As the potential at a node A drops, the potential at the node 9 also drops. At the same time, however, since the potential at the node B rises when the potential at the node A drops, the potential at the node 9 is transferred toward a higher level due to the capacitance of the capacitor 216. This results in mitigating the drop of the potential at the node 9. The stabilizer 10 also mitigates the rise of the potential at the node 9 observed when the potential at the node A rises.

The capacitor 216 is preferably substantially equal to the capacitance between a gate and a source of an n-type MOS transistor 105. The capacitor 216 is preferably formed by coupling a source and a drain of a MOS transistor as shown in FIG. 3B.

In this example, the driver 5 is a C-MOS driver or an N-MOS driver. Alternatively, the driver of this example may be composed of an open drain transistor.

Hereinbelow, an example of using an open drain type driver will be described with reference to FIG. 9.

Figure 9:
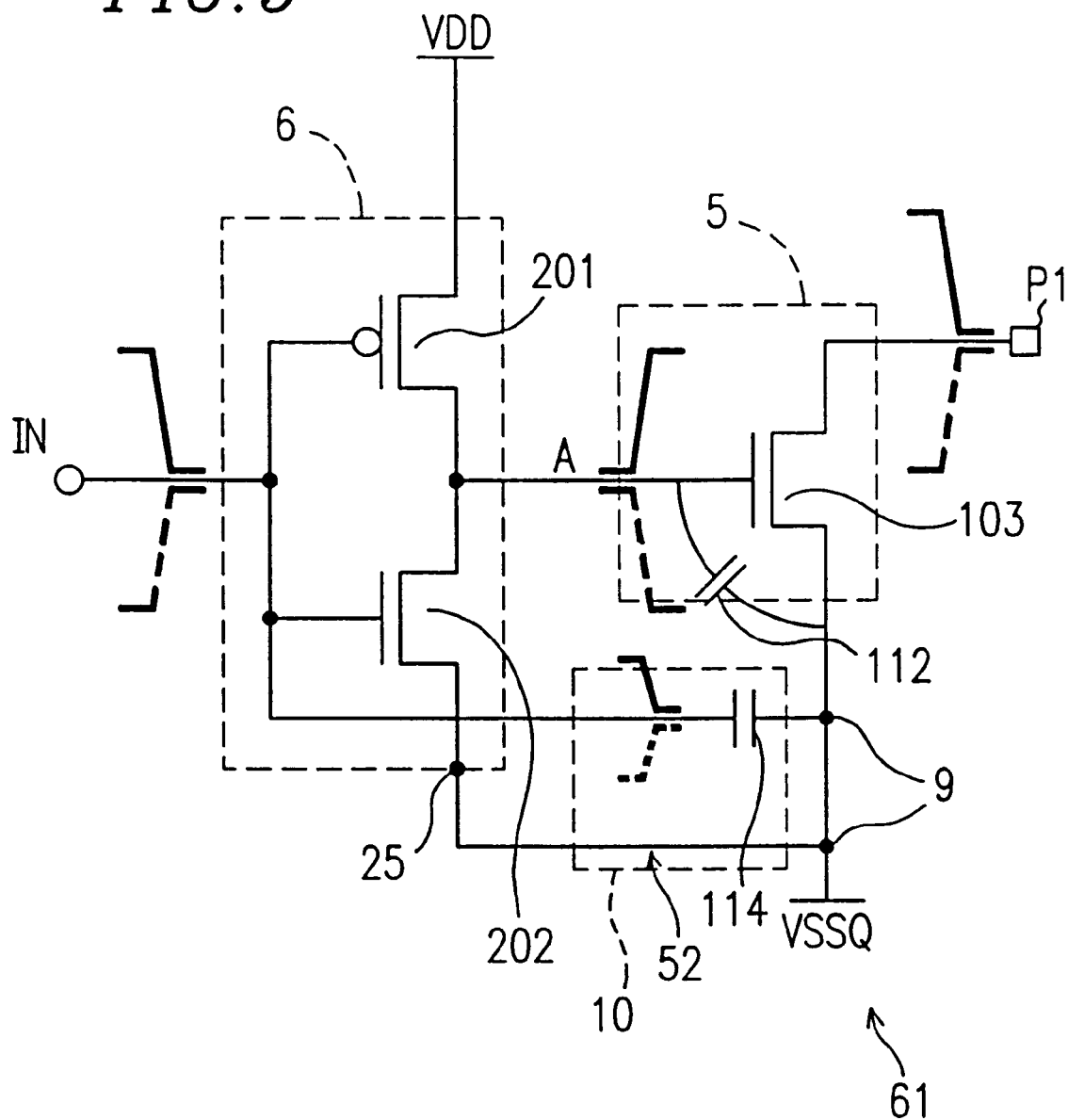
FIG. 9 is a circuit diagram of still another semiconductor integrated circuit of Example 3, where a driver is of an open drain type.

Referring to FIG. 9, a semiconductor integrated circuit 61 includes an open drain type driver 5, a control circuit 6 for controlling the driver 5, and a stabilizer 10.

The driver 5 includes an n-type MOS transistor 103. The control circuit 6 includes a p-type MOS transistor 201, an n-type MOS transistor 202, and a node 25. The stabilizer 10 includes an interconnect 52 for coupling the node 25 and a node 9 and a capacitor 114 for coupling a node IN and the node 9. With this construction, the stabilizer 10 shown in FIG. 9 mitigates the change in the potential at the node 9.

The capacitance of the capacitor 114 is preferably substantially equal to a value obtained by subtracting the gate-source capacitance of the n-type MOS transistor 202 from the gate-source capacitance of the n-type MOS transistor 103. The capacitor 114 is preferably formed by coupling a source and a drain of an MOS transistor as shown in FIG. 3B.

The stabilizer 10 shown in FIG. 9 may include only one of the interconnect 52 and the capacitor 114. When the stabilizer 10 shown in FIG. 9 includes only the interconnect 52, the gate-source capacitance of the n-type MOS transistor 103 is preferably substantially equal to the gate-source capacitance of the n-type MOS transistor 202.

When the stabilizer 10 shown in FIG. 9 includes only the capacitor 114, the capacitance of the capacitor 114 is preferably substantially equal to the gate-source capacitance of the n-type MOS transistor 103.

EXAMPLE 4

Figure 10:
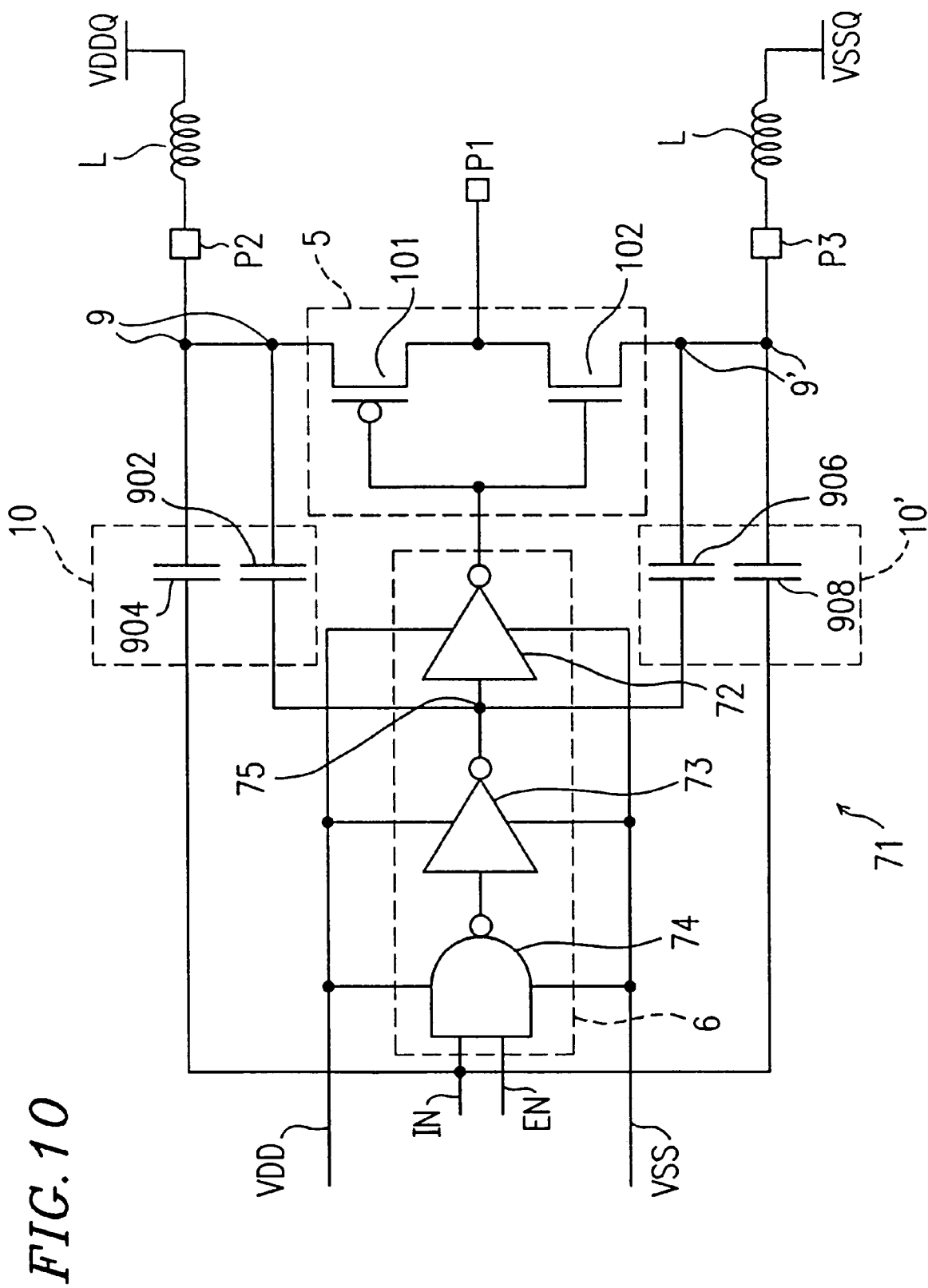
FIG. 10 is a circuit diagram of a semiconductor integrated circuit according to Example 4 of the present invention.

FIG. 10 is a circuit diagram of a semiconductor integrated circuit of Example 4 according to the present invention. In the semiconductor integrated circuit of this example, a node at which the potential transfers in reverse to the potential change at a gate of a MOS transistor of a driver for driving a load and a node connected to a source of the MOS transistor are coupled.

Referring to FIG. 10, a semiconductor integrated circuit 71 of this example includes a driver 5 for driving a load (not shown), a control circuit 6 for controlling the driver 5, and stabilizers 10 and 10'.

The driver 5 includes a p-type MOS transistor 101 and an n-type MOS transistor 102. The control circuit 6 includes inverters 72 and 73 and a NAND circuit 74.

The stabilizer 10 includes a capacitor 902 for coupling a node 9 and a node 75 and a capacitor 904 for coupling the node 9 and a node IN. The stabilizer 10' includes a capacitor 906 for coupling a node 0' and the node 75 and a capacitor 908 for coupling the node 9' and the node IN.

That is, in this example, a node at which the potential transfers in reverse to the potential change at a gate of a MOS transistor of a driver for driving a load and a node connected to a source of the MOS transistor are coupled.

In the control circuit 6 shown in FIG. 10, the inverters 72 and 73 and the NAND gate 74 are disposed in series. In such a series arrangement of the logic elements such as inverters, the "node at which the potential transfers in reverse to the potential change at a gate of a MOS transistor of a driver for driving a load" may correspond to input nodes of every other logic elements arranged in series. In other words, each of the stabilizer 10 and 10' couples the source of the MOS transistor of the driver 5 for driving the load with the input nodes of every other logic elements of the control circuit 6 by means of the capacitors. One of the input nodes coupled to the node 9 may be the input node of the logic element which is directly connected to the driver 5.

The sum of the capacitances of the capacitors 902 and 904 may be substantially equal to the capacitance of the p-type MOS transistor 101. Likewise, the sum of the capacitance of the capacitors 906 and 908 may be substantially equal to the capacitance of the n-type MOS transistor 102.

Each of the capacitors 902, 904, 906, and 908 is preferably formed by coupling a source and a drain of a MOS transistor as shown in FIG. 3B.

Although the semiconductor integrated circuit 71 of FIG. 10 includes the stabilizer 10 and 10', it may include only one of the stabilizers.

Although the stabilizer 10 of this example shown in FIG. 10 includes the capacitors 902 and 904, it may include only one of the capacitors. Alternatively, the stabilizer 10 may further include a capacitor for coupling the node 9 and a node at which the potential transfers in reverse to the potential change at the gate of the MOS transistor 101.

In the case where the stabilizer 10 includes only one capacitor, the gate-source capacitance of the p-type MOS transistor 101 is preferably substantially equal to the capacitance of the capacitor.

Likewise, although the stabilizer 10' of this example shown in FIG. 10 includes the capacitors 906 and 908, it may include only one of the capacitors. Alternatively, the stabilizer 10' may further include a capacitor for coupling the node 9 and a node at which the potential transfers in reverse to the potential change at the gate of the MOS transistor 102.

In the case where the stabilizer 10' includes only one capacitor, the gate-source capacitance of the p-type MOS transistor 102 is preferably substantially equal to the capacitance of the capacitor.

EXAMPLE 5

Figure 11:
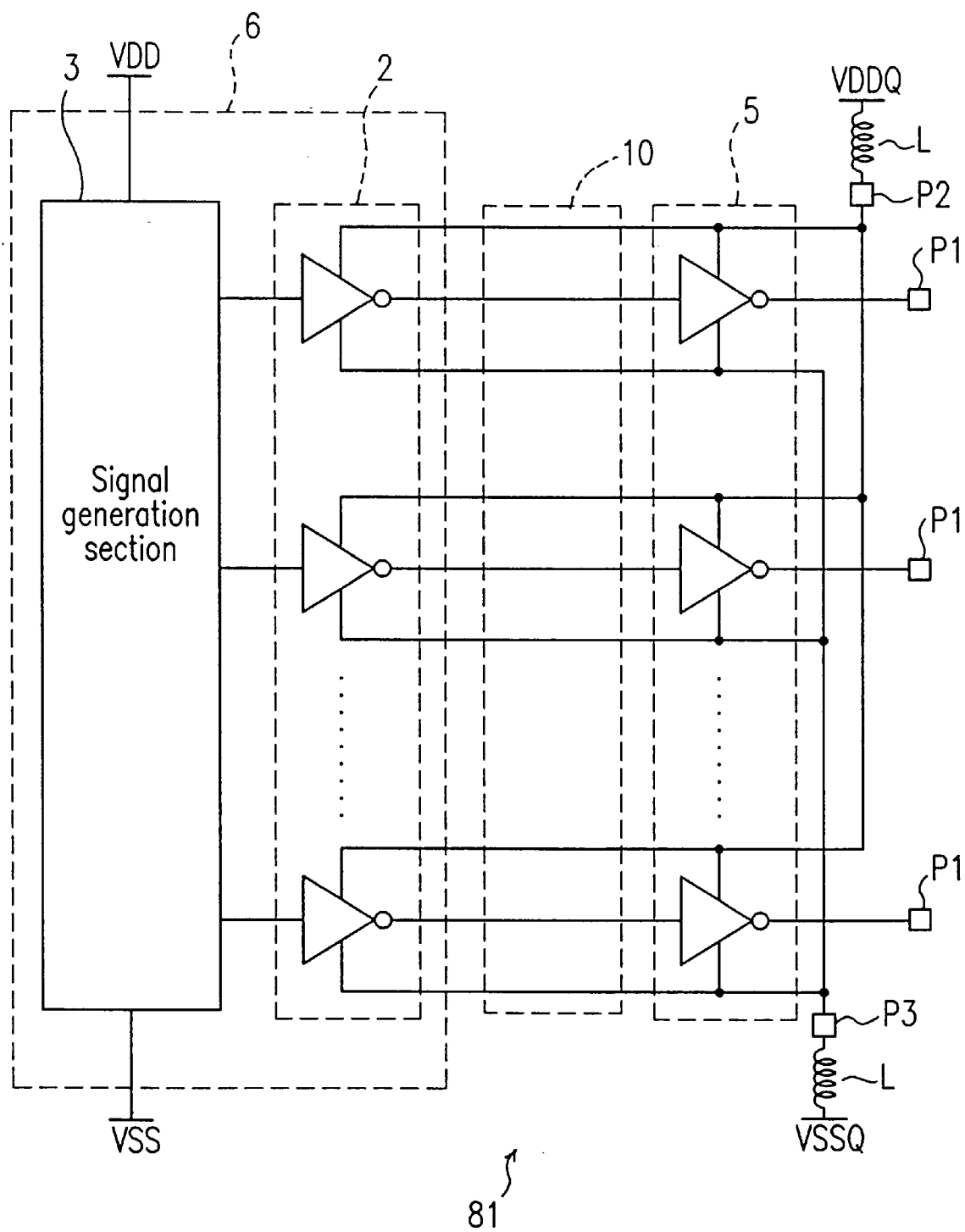
FIG. 11 is a circuit diagram of a semiconductor integrated circuit according to Example 5 of the present invention.

FIG. 11 is a circuit diagram of a semiconductor integrated circuit of Example 5 according to the present invention.

Referring to FIG. 11, a semiconductor integrated circuit 81 of this example includes a driver 5 for driving a load (not shown), a control circuit 6 for controlling the driver 5, and a stabilizer 10.

The driver 5 includes a plurality of inverters. The control circuit 6 includes a buffer section 2 and a signal generation section 3. The buffer section 2 includes a plurality of inverters, while the signal generation section 3 includes a plurality of logic elements such as inverters. The buffer section 2 and the driver 5 share the same power supplies. More specifically, the inverters of the buffer section 2 and the inverters of the drivers 5 are connected to a positive power supply VDDQ and a negative power supply VSSQ. The inverters of the driver 5, the buffer section 2, and the signal generation section 3 may be C-MOS transistors.

In a conventional driver, each inverter is provided with an individual power supply. In such a construction, the supply potential of the driver changes with the transfer of the potential of a signal input into the driver. This change in the supply potential delays the operation of the driver and thus restricts the data transfer frequency.

In this example, however, the buffer section 2 and the driver 5 share the same power supplies, and thus the operation of the driver is not delayed for the following reason.

A change in the gate potential of an inverter of the buffer section 2 changes the supply potential of the inverter of the buffer section 2. Likewise, a change in the gate potential of an inverter of the driver 5 changes the supply potential of the inverter of the driver 5. The change in the supply potential of the buffer section 2 transfers in reverse to the change in the supply potential of the driver 5. Since the buffer section 2 and the driver 5 share the power supplies, the change in the supply potential of the driver 5 is cancelled by the change in the supply potential of the buffer section 2.

Figure 14B:
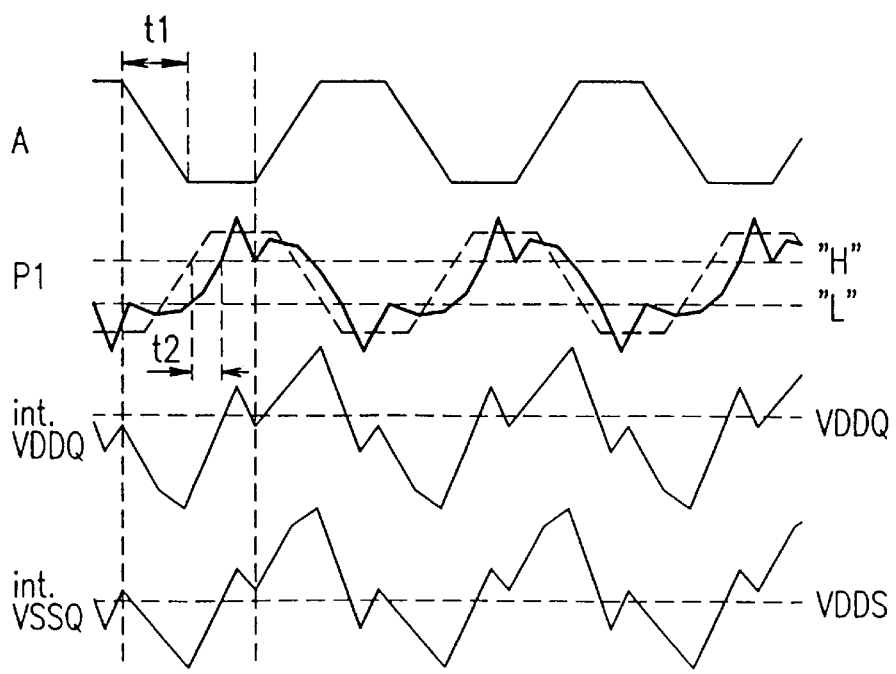
FIG. 14B is a waveform chart showing the simulation results of the operation of the conventional circuit of FIG. 14A.
Figure 15:
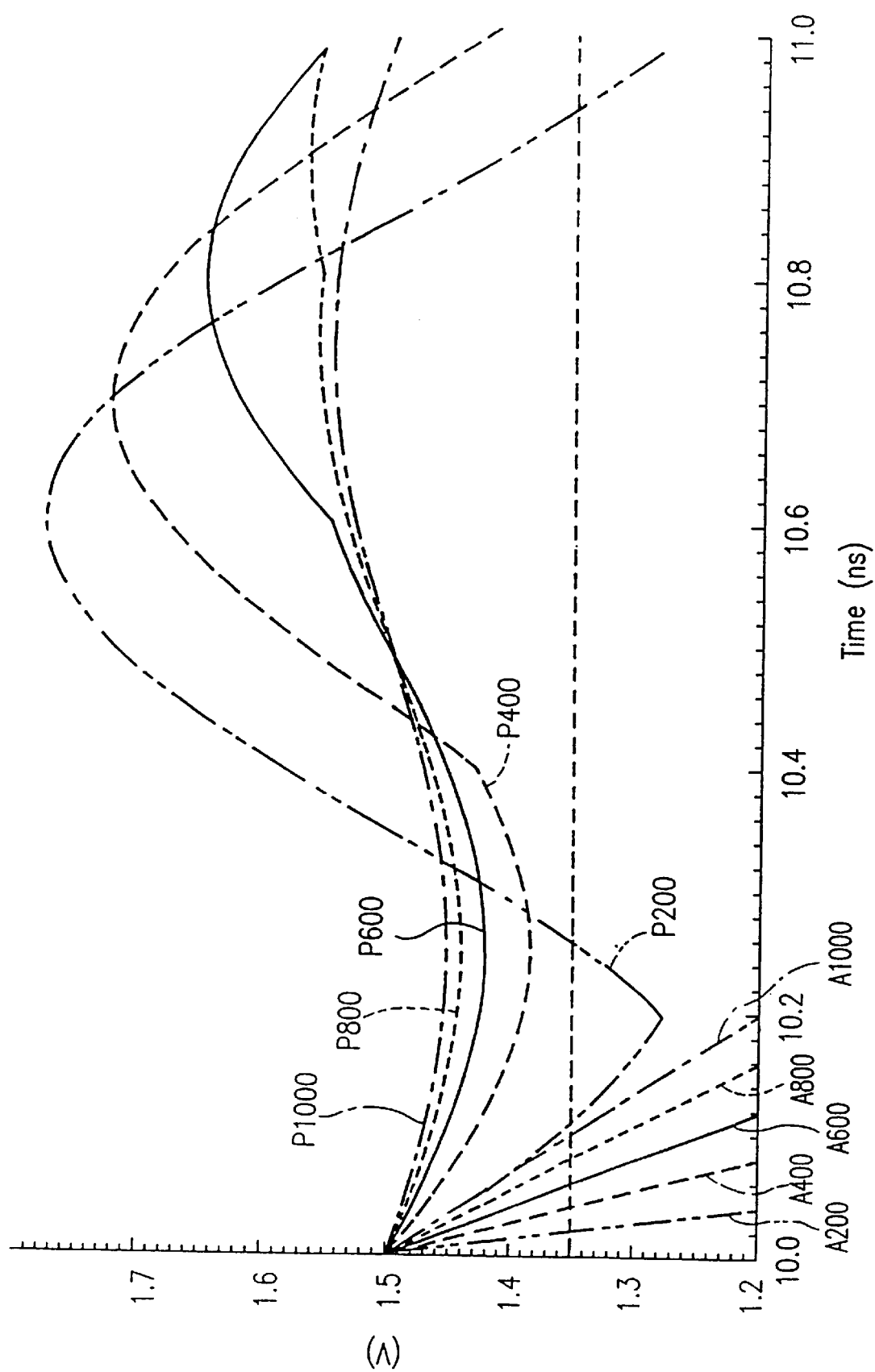
FIG. 15 is a graph showing the simulation results of the change in the potential at a source node of the circuit of FIG. 14A observed when the potential at an input node transfers from HIGH to LOW.

As described above, it is difficult for the conventional driver to drive a load stably at a frequency of 1 GHz or more (see FIG. 4). The reason is that there exist an inductance L generated by the bonding wire between the external positive power supply VDDQ and the pad P2 and an inductance L generated by the bonding wire between the external negative power supply VSSQ and the pad P3 (see FIG. 14). Such inductance L serve as impedances, which prevent the potential changes at the positive power supply VDDQ and the negative power supply VSSQ from being stabilized. An impedance Z of the bonding wire is represented by $Z=j\omega L$ ($\omega=2\pi f$). The inductance L at the bonding wire is generally in the order to nanohenry (nH). Accordingly, if the changes in the potentials at the positive power supply VDDQ and the negative power supply VSSQ in the form of frequency is in the order of GHz, a potential change of several hundred millivolts is generated due to a current noise of several ten milliamperes. Because of the inductance L at the bonding wire, the potential change due to a noise is larger as the frequency of the noise is higher.

Figure 12:
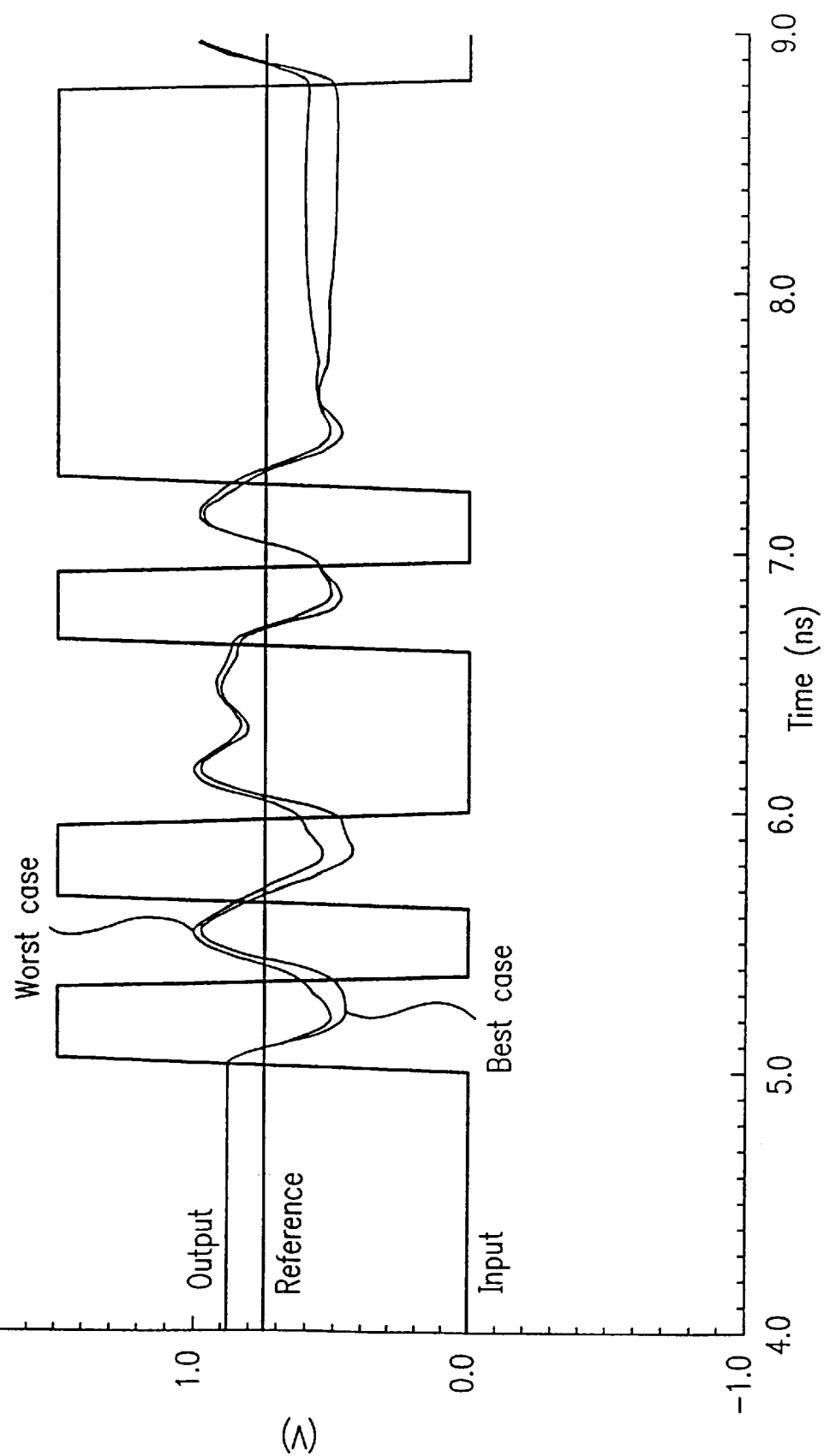
FIG. 12 is a graph showing the simulation results of the relationship between signals input into and output from a driver of the semiconductor integrated circuit of Example 5.

FIG. 12 shows the simulation results of the relationship between the signals input into and output from the driver 5 of the semiconductor integrated circuit 81 shown in FIG. 11. In this case, the semiconductor integrated circuit 81 is provided with eight drivers 5 to output 8-bit data. As described above, in the case where the eight bits transfer in the same direction simultaneously, the delay in the data transfer is largest among other cases due to noise appearing at the source nodes of the eight drivers. This is the worst case. In the case where seven bits among the eight bits transfer in the same direction simultaneously and the remaining one bit transfers in a different direction, the data transfer of the one bit is accelerated due to a noise appearing at the source node of the driver of the one bit which has transferred in the reverse direction. This is the best case. As is observed from FIG. 12, the semiconductor integrated circuit 81 provided with the stabilizer 10 operates normally both in the best case and the worst case.

More specifically, in this example, since the buffer section 2 and the driver 5 share the same power supplies, the change in the supply potential of the driver 5 is cancelled by the change in the supply potential of the buffer section 2 as described above. This allows for the driving of the load at a frequency higher than 1 GHz. Even the driving of the load at a frequency higher than 1.6 GHz is also possible.

EXAMPLE 6

Figure 13:
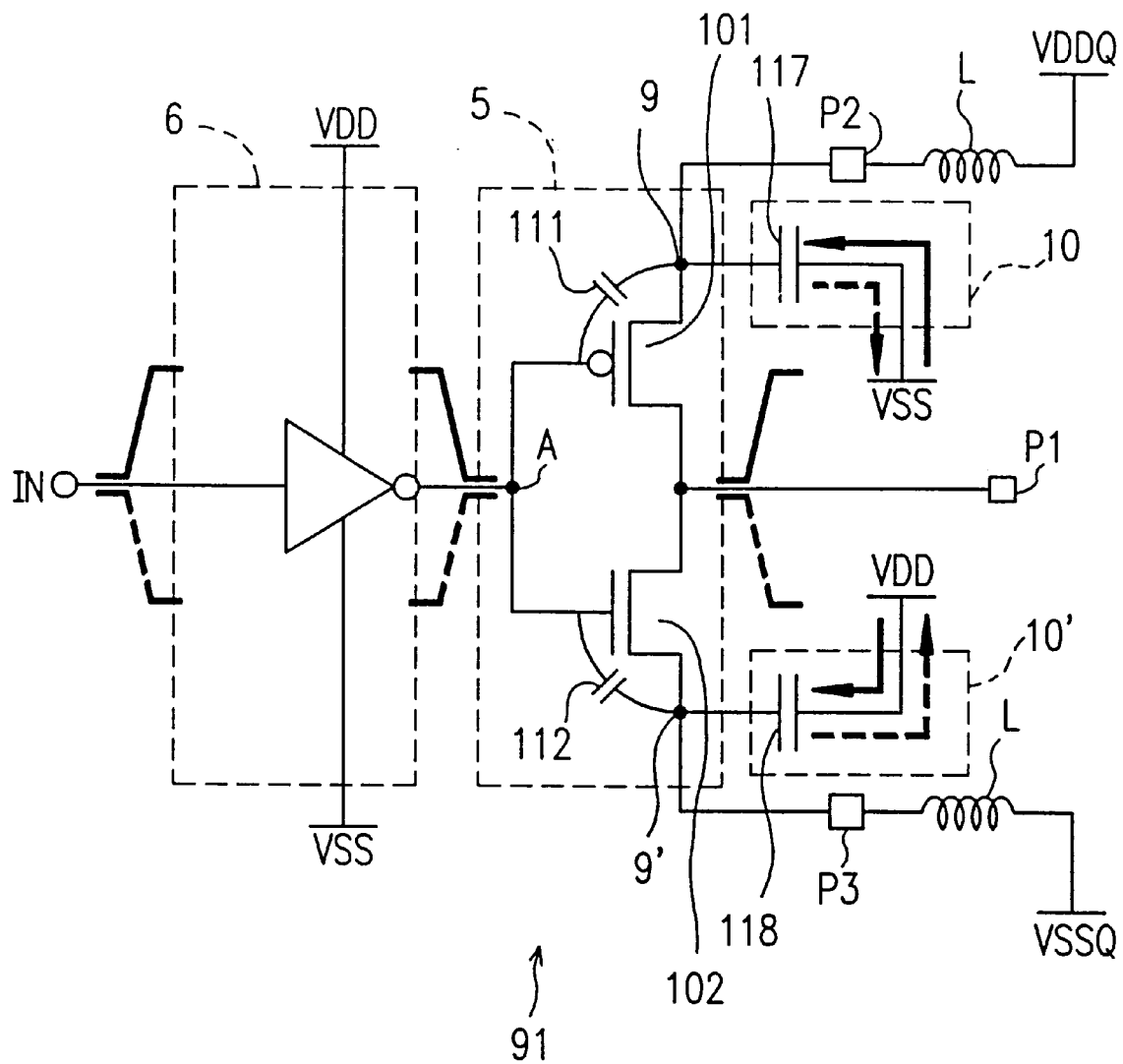
FIG. 13 is a circuit diagram of a semiconductor integrated circuit according to Example 6 of the present invention.

FIG. 13 is a circuit diagram of a semiconductor integrated circuit of Example 6 according to the present invention.

Referring to FIG. 13, a semiconductor integrated circuit 91 of this example includes a driver 5 for driving a load (not shown), a control circuit 6 for controlling the driver 5, and stabilizers 10 and 10'.

The driver 5 includes a p-type MOS transistor 101 and an n-type MOS transistor 102. The control circuit 6 includes an inverter connected to power supplies VDD and VSS. The stabilizer 10 includes a capacitor 117 for coupling the power supply VSS and a node 9. The stabilizer 10' includes a capacitor 118 for coupling the power supply VDD and a node 9'.

In Example 6, the smooth capacitors 117 and 118 are incorporated in power supplies for the driver 5. This increases the capacities of the power supplies.

Assume the case where the potential at a node A transfers from HIGH to LOW as shown by the bold line in FIG. 13. The power supply VSS receives a charge which has been drained from the node A to drop the potential at the node A. This momentarily raises the potential at the power supply VSS connected to the node A. When the source node 9 of the MOS transistor 101 is connected to the power supply VSS via the capacitor 117, the source node 9 is provided with a noise, which raises the potential at the source node 9 substantially simultaneously with the drop of the potential at the node A. This mitigates the drop of the potential at the source node 9 due to the drop of the potential at the node A. At this time, since the power supply VDD is disconnected from the node A, the potential at the power supply VDD hardly changes due to the change in the potential at the node A. In other words, the source node 9 of the MOS transistor 101 should preferably be coupled with the power supply VSS for producing a capacitance, not with the power supply VDD.

As in the node 9, the source node 9' of the MOS transistor 102 is coupled with the power supply VDD via the capacitor 118. This mitigates a noise at the source node 9' due to the rise of the potential at the node A.

The gate capacitance can be efficiently utilized by forming the capacitor 117 of an n-type MOS transistor where the gate electrode is connected to the node 9 and the source/drain electrode is connected to the power supply VSS. This is because, since the potential at the node 9 is higher than that at the power supply VSS, a channel is formed between the source and the drain of the n-type MOS transistor. When the capacitor 117 is formed of a p-type MOS transistor, the efficient utilization of the gate capacitance can be obtained by connecting the gate electrode of the p-type MOS transistor to the power supply VSS and connecting the source/drain electrode thereof to the node 9. As for the capacitor 118, substantially the same effect can be obtained by inverting the polarity from the case of the capacitor 117 described above.

In Examples 1 to 6 above, the driver 5 may be of a C-MOS type, an N-MOS type, or an open drain type. The control circuit 6 may be a logic gate such as an inverter and a NAND gate.

Thus, according to the present invention, the change in the level of the power supplies VDDQ and VSSQ at the operation of the driver can be stabilized, and thus the degraded rising of the output voltage can be mitigated.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor integrated circuit comprising:
   a driver including a MOS transistor for driving a load; and
   a stabilizer for stabilizing a change in a voltage at a source of the MOS transistor due to a gate-source parasitic capacitance of the MOS transistor
   wherein, when the potential at the source of the MOS transistor transfers from a first potential to a second potential different from the first potential, the stabilizer supplies charges to the source so as to stabilize the change in the potential at the source as a result of the stabilizer being adapted to use the parasitic capacitance between the gate and source of the MOS transistor and feed forward the charges to the source from a circuit preceding the MOS transistor.

2. A semiconductor integrated circuit according to claim 1, wherein the driver drives the load at a frequency of 1 GHz or more.

3. A semiconductor integrated circuit according to claim 1, further comprising a logic circuit including a MOS transistor for generating a signal received by the driver,
   wherein the stabilizer includes a coupler for coupling the source of the MOS transistor of the driver and a source of the MOS transistor of the logic circuit to a first power supply.

4. A semiconductor integrated circuit according to claim 3, wherein the first power supply comprises one of a grounding power supply and a power supply having a potential higher than the grounding power supply.

5. A semiconductor integrated circuit according to claim 1, further comprising a logic circuit,
   wherein the stabilizer includes a capacitor for coupling the source of the MOS transistor of the driver and a node of the logic circuit at which a potential transfers in reverse to a change in a potential at a gate of the MOS transistor of the driver.

6. A semiconductor integrated circuit according to claim 5, wherein the capacitor comprises a feed effect transistor having a drain and a source coupled with each other.

7. A semiconductor integrated circuit according to claim 1, wherein the driver further comprises an additional MOS transistor connected in series with the MOS transistor, and the semiconductor integrated circuit further comprises an additional stabilizer for stabilizing a change in a voltage at a source of the additional MOS transistor due to a gate-source parasitic capacitance of the additional MOS transistor,
   wherein the stabilizer and the additional stabilizer respectively comprise:
      a first power supply and a second power supply different from the first power supply, and
      a first capacitor coupled to the source of the MOS transistor and the first power supply and a second capacitor coupled to a source of the additional MOS transistor and the second power supply.

8. A semiconductor integrated circuit according to claim 7, wherein each of the first and second capacitors comprises a feed effect transistor having a drain and a source coupled with each other.

9. A semiconductor integrated circuit comprising:
   a driver including a MOS transistor for driving a load; and
   a stabilizer for stabilizing a change in a voltage at a source of the MOS transistor due to a gate-source parasitic capacitance of the MOS transistor,
   wherein the driver further comprises an additional MOS transistor connected in series with the MOS transistor, and the semiconductor integrated circuit further comprises an additional stabilizer for stabilizing a change in a voltage at a source of the additional MOS transistor due to a gate-source parasitic capacitance of the additional MOS transistor, and
   wherein the stabilizer and the additional stabilizer respectively comprise:
      a first power supply and a second power supply different from the first power supply, and a first capacitor coupled to the source of the MOS transistor and the first power supply and a second capacitor coupled to a source of the additional MOS transistor and the second power supply.

10. A semiconductor integrated circuit according to claim 9, wherein each of the first and second capacitors comprises a feed effect transistor having a drain and a source coupled with each other.

11. A semiconductor integrated circuit comprising:

a driver including a first MOS transistor for driving a load;

a stabilizer for stabilizing a change in a voltage at a source of the first MOS transistor due to a gate-source parasitic capacitance of the first MOS transistor, and a logic circuit including a second MOS transistor for generating a signal received by the driver, wherein the stabilizer includes a coupler for coupling the source of the first MOS transistor and a source of the second MOS transistor to a first power supply, wherein, when the potential at the source of the first MOS transistor transfers from a first potential to a second potential different from the first potential, the stabilizer supplies charges to the source of the first MOS transistor so as to stabilize the change in the potential at the source of the first MOS transistor as a result of the stabilizer being adapted to use the gate-source parasitic capacitance of the first MOS transistor and feed forward the charges to the source of the first MOS transistor from the logic circuit.

* * * * *